United States Patent [19]
Senor et al.

[11] Patent Number: 4,828,515
[45] Date of Patent: May 9, 1989

[54] BOTTOM LOADED I.C. SOCKET

[75] Inventors: Ronald Senor, No. Attleboro; Michael T. Cummings, So. Attleboro, both of Mass.

[73] Assignee: Augat Inc., Mansfield, Mass.

[21] Appl. No.: 170,160

[22] Filed: Mar. 18, 1988

[51] Int. Cl.⁴ .............................................. H01R 13/11
[52] U.S. Cl. ..................................... 439/862; 439/874
[58] Field of Search ................ 439/736, 862, 874, 876

[56] References Cited
U.S. PATENT DOCUMENTS 4,533,187  8/1985  Kirkman .............................. 439/736

Primary Examiner—Joseph H. McGlynn
Attorney, Agent, or Firm—Weingarten, Schurgin, Gagnebin & Hayes

[57] ABSTRACT

An improved anti-wicking connector for releasably connecting an integrated circuit or other electrical component to a printed circuit board. Electrically conductive contacts are pre-formed into a loop, horizontal section, and tail configuration for insertion into respective recesses of an electrically insulating housing. Housing recesses have top openings to receive integrated circuit leads and bottom openings to receive the contacts and through which the electrically conductive contacts extend for connecting to the printed circuit board. The loop of the contact is inserted into the housing recess and secured in place by heat-staking. Horizontal sections of the inserted contact loops are dimensioned to substantially seal the bottom opening of the recesses to prevent flux and solder wicking up into the housing which can tack or contaminate the I.C. leads during or after soldering of the contact tails to the circuit board. Integrated circuit leads are inserted into recess top openings until the distal ends of the I.C. leads abut the horizontal sections of the contact loops. Contact is also made between the end of the contact loop and the I.C. lead.

14 Claims, 3 Drawing Sheets

BOTTOM LOADED I.C. SOCKET

FIELD OF THE INVENTION

This invention relates to electrical connectors and more particularly to anti-wicking connectors for electrical components.

BACKGROUND OF THE INVENTION

It is well-known in the art to connect dual-in-line integrated circuits to a circuit board by soldering a connector to the circuit board and releasably inserting the I.C. leads into the connector. The I.C. may thereafter be disengaged from the connector for repair or replacement. In some applications, it is desirable to mate the I.C. and the connector prior to soldering the connector to the circuit board. A disadvantage associated with this method of connection is that, during the soldering process, flux and solder tend to wick up the connector contact tail and contaminate the I.C. leads. Thus, the I.C. may become affixed to the connector preventing disengagement of the I.C. from the connector. U.S. Pat. No. 4,556,267 discloses an attempt to remedy the wicking problem.

However, the '267 connector is complex and comparatively expensive to manufacture. The '267 connector requires a stop member, integrally formed within each connector recess to stem the flow of solder into the connector. Because the integrally formed stop member within the connector has heretofore been considered necessary to remedy the wicking problem, molding the '267 connector is a relatively complex and expensive process.

It has now been discovered that the wicking problem can be remedied using an improved self-sealing connector which does not require a stop member and which is therefore both simpler and cheaper to manufacture than previous connectors.

SUMMARY OF THE INVENTION

The improved anti-wicking connector of the present invention is self-sealing to provide a simpler more effective way to releasably connect an integrated circuit or other electrical or electronic component to a circuit board. The present invention permits mating the I.C. to the connector prior to soldering the connector to the circuit board and, thereafter, permits soldering the connector to the circuit board while preventing solder from wicking up into the connector to contaminate the I.C. leads.

Briefly, the improved connector of the present invention comprises a plurality of pre-formed contacts disposes within a corresponding plurality of recesses in a housing formed of an insulating material. The plurality of recesses are typically disposed in a dual-in-line configuration to receive the leads of a dual-in-line integrated circuit device. The recesses have bottom openings through which the contacts are inserted and top openings through which the I.C. leads are introduced into the housing.

The contacts are made of an electrically conductive material and are pre-formed into a loop, horizontal section and tail configuration. The loop section is inserted into the recess through recess bottom opening and may be secured by detents integrally formed within the housing which cooperate with corresponding indents in the contact loop. When the contact is inserted in its respective recess, the contact horizontal section substantially seals the recess bottom opening. Wicking of flux and solder into the recess during soldering is thereby eliminated. The contact tail section extends from the bottom opening of the recess into a corresponding circuit board socket.

Contacts are secured within the recesses by heat-staking the end faces of walls between adjacent recesses and the lip extending substantially the length of the housing adjacent the tails of the inserted contacts. Heat-staking may be effected by using a heat wheel or by other conventional means.

The I.C. leads are introduced into the assembled connector via recess top openings and bottom out against contact horizontal sections. When so inserted, the I.C. leads are also in contact with the end of the contact loop.

The mated I.C. and connector may then be placed on a circuit board for solder connection. Because the sealing of the recess bottom openings by the contact horizontal sections prevents solder and flux wicking up into the housing, the risk of flux or solder contaminating or tacking the I.C. leads is eliminated. Consequently, the I.C. remains removable from the connector for repair or replacement.

DESCRIPTION OF THE DRAWINGS

The invention will be more fully understood from the following detailed description taken in conjunction with the accompanying drawings, in which.

DETAILED DESCRIPTION OF THE INVENTION

Figure 1B:
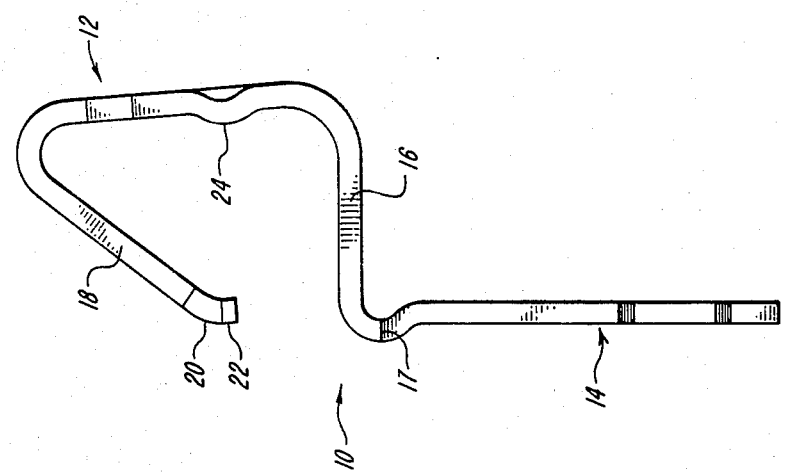
FIG. 1B is a side view of a contact of the present invention.
Figure 1A:
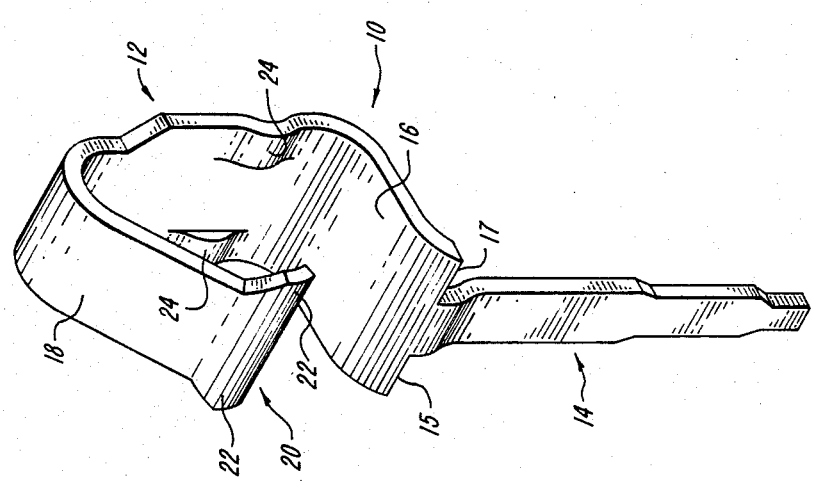
FIG. 1A is a perspective view of a contact of the present invention.

With reference now to the drawings and more particularly to FIGS. 1A and 1B, the contact 10 of the present invention is illustrated in two perspectives. Contact 10 is fabricated using conventional processes from a resilient electrically conductive material such as beryllium copper, phosphor bronze or copper alloy. Contact 10 comprises loop 12, tail 14 and horizontal section 16. Horizontal section 16 includes shoulders 17. The downward sloping portion 18 of loop 12 terminates at loop end 20 which comprises flanges 22. Loop end 20 is disposed in an approximately coaxial spaced relationship with the longitudinal axis of tail 14. Indents 24 cooperate with corresponding detents integrally formed within the housing recess to prevent dislocation of the contact 10 within the connector housing.

Figure 2:
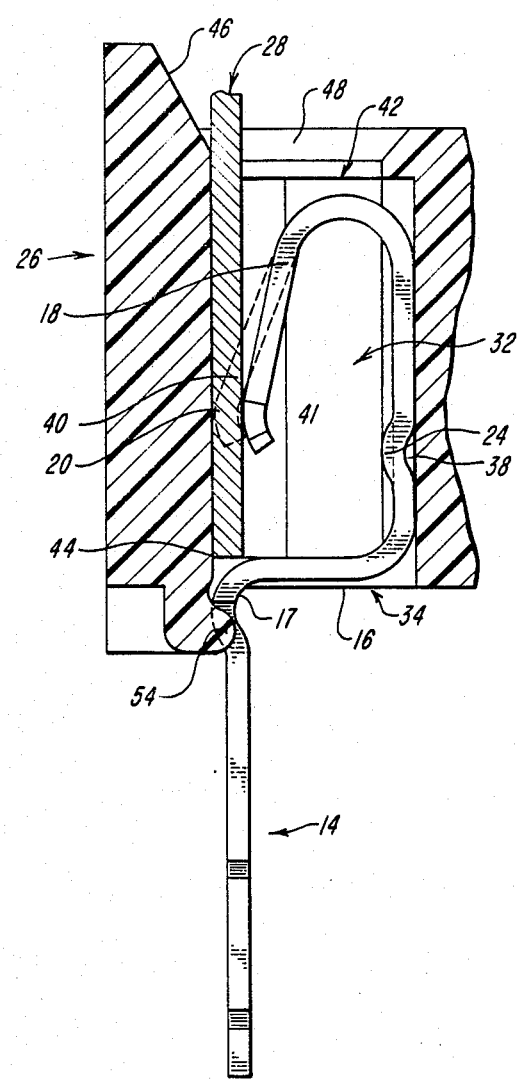
FIG. 2 illustrates a cross-sectional view of a contact of the present invention and an I.C. inserted in a recess of the housing of the present invention.

Referring now to FIG. 2, a recess 32 of connector housing 26 is illustrated in cross-section. Contact 10 is inserted into housing recess 32 through recess bottom opening 34.

When contact 10 is disposed within recess 32, and before I.C. lead 28 is inserted into recess 32, downward sloping portion 18 of loop 12 is in the position indicated by the dotted lines 40. In addition, contact tail 14 extends through recess bottom opening 34 and horizontal section 16 substantially seals bottom opening 34.

I.C. lead 28 is inserted into recess 32 through recess top opening 42 until distal end 44 of I.C. lead 28 bottoms out against horizontal section 16. Bevelled surfaces 46, 48 of housing 26 and loop downward sloping portion 18 guide I.C. lead end 44 towards horizontal section 16. As I.C. lead 28 is inserted into recess 32, it strikes loop downward sloping portion 18 urging downward sloping portion 18 from the position indicated by dotted lines 40 to the position indicated by solid lines 41. Contact between loop end 20 of contact 10 and I.C. lead 28 is thereby achieved.

When the I.C. is mated to the connector, the connector is mounted on and soldered to the circuit board. Tails 14 of the connector are inserted into respective corresponding circuit board sockets and are soldered therein by solder wave or other conventional soldering techniques.

During the soldering process, solder and flux tend to wick up contact tail 14 due to capillary action. In previous connectors, the wicking problem has caused flux or solder to enter the contact recess to contaminate the I.C. lead. Moreover, the I.C. lead may inadvertently be soldered (tacked) to the contact prohibiting separation of the I.C. from the connector. Flux and solder cannot enter recess 32 of the present invention because horizontal section 16 of contact 10 substantially seals recess bottom opening 34. Thus, flux and solder wicking up tail 14 can engage only the bottom exterior surface of horizontal section 16, and contamination of I.C. lead 28 is thereby avoided. Consequently, the connector of the present invention assures releasable engagement of the I.C. device and the connector and provides a good electrical connection between the I.C. and the circuit board.

Figure 3:
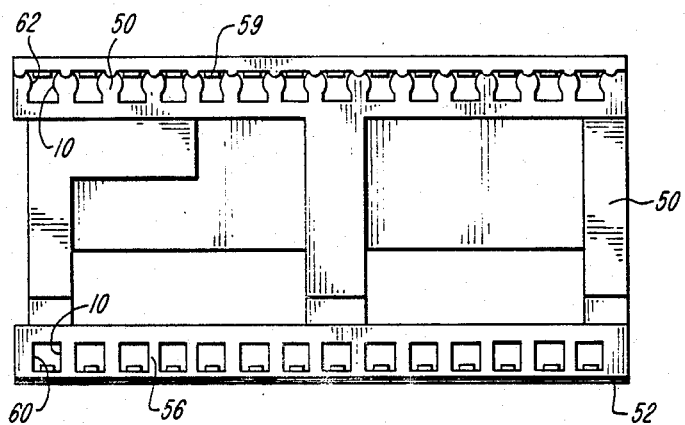
FIG. 3 is a bottom view of a portion of a connector housing of the present invention after insertion of the contacts.
Figure 4A:
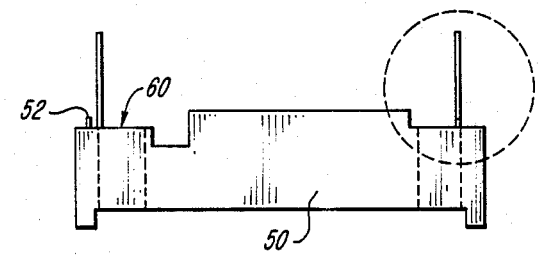
FIG. 4A is an end view of the connector of the present invention after insertion of the contacts.
Figure 4B:
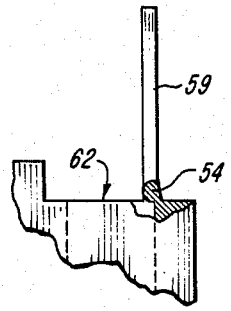
FIG. 4B is an enlarged view of the circled portion of FIG. 4A.

Referring now to FIGS. 3, 4A and 4B, bottom and end views respectively of housing 50 are illustrated. Housing 50 comprises a first lip 52, shown prior to heat-staking and a second lip 54 shown subsequent to heat-staking. Lips 52 and 54 are integrally formed with housing 50. A first plurality of recesses 60 is shown with contacts 10 inserted and prior to heat-staking. Walls having end faces 56 separate adjacent recesses. A second plurality of recesses 62 with contacts 10 inserted is shown subsequent to heat-staking. The heat-staking process splays wall end faces 58 to capture the inserted contacts 10 within the connector recesses upon cooling of the wall end faces 58. In addition, heat-staking urges lip 54 between tails 59 of inserted contacts 10. As illustrated in FIG. 2, contact shoulders 17 abut heat-staked lip 54 further securing contacts 10 within recesses 32 when I.C. lead 28 is inserted into recess 32.

The above described invention is illustrative of a novel connector which overcomes significant disadvantages of prior connectors. Other modifications, embodiments and departures from the present disclosure are possible without departing from the inventive concept contained herein. The invention is not to be limited to I.C. connectors, but is also applicable to other electronic and electrical device connectors or sockets. Consequently, the invention is to be viewed as embracing each and every novel feature and novel combination of features present in or possessed by the technique and articles herein disclosed and are limited solely by the scope and spirit of the appended claims.

What is claimed is:

1. A self-sealing anti-wicking electrical connector for releasably connecting an electrical component to a circuit board comprising:
    a housing;
    a plurality of recesses disposed within said housing, each of said recesses including a lead receiving aperture and a contact receiving aperture; and
    a plurality of contacts each disposed within a respective one of said plurality of recesses, each of said plurality of contacts being unitary and including a single looped section inserted into a respective one of said recesses and configured to engage an integrated circuit lead inserted into the recess through the lead receiving aperture, a single horizontal section integral with said looped section and traversing the contact receiving aperture to substantially seal the contact receiving aperture and to engage the distal end of the inserted integrated circuit lead, and a tail integral with said horizontal section and depending from the contact receiving aperture.

2. The electrical connector of claim 1 wherein said recesses are disposed in at least one line.

3. The electrical connector of claim 1 wherein said housing is formed of an electrically insulating material and said contacts are made from a resilient electrically conductive material.

4. The electrical connector of claim 1 further comprising at least one integrally formed detent extending from a wall of each of said plurality of recesses and wherein each of said contact looped sections further includes at least one corresponding indent to receive a respective one of said recess wall detents.

5. The electrical connector of claim 1 wherein each of said contact looped sections includes a flanged distal end.

6. The electrical connector of claim 1 further comprising walls integrally formed with said housing and disposed between adjacent ones of said plurality of recesses, said walls including end-faces disposed between adjacent ones of said plurality of contact receiving apertures and wherein said end-faces are splayed by a heat-staking process after insertion of said plurality of contact looped sections into said plurality of recesses to retain said plurality of contacts within said plurality of recesses.

7. The electrical connector of claim 1 further comprising walls integrally formed with said housing and disposed between adjacent ones of said plurality of recesses said walls including end-faces disposed between adjacent ones of said plurality of contact receiving apertures, and wherein
    said end-faces are splayed by heat-staking after insertion of said plurality of contacts into said plurality of recesses to retain said plurality of contacts within said plurality of recesses, and
    each of said contact looped sections includes a flanged distal end.

8. The electrical connector of claim 1 further comprising at least one lip integrally formed with said housing adjacent said plurality of recesses wherein portions of said at least one lip are urged between adjacent ones of said depending contact tails when said plurality of contacts is disposed within respective ones of said plurality of recesses.

9. The electrical connector of claim 8 wherein each of said plurality of contact horizontal sections further includes a shoulder said shoulder abutting the portion of said lip urged between adjacent ones of said contact tails when said plurality of contacts is disposed within respective ones of said plurality of recesses.

10. An anti-wicking connector for electrically connecting an electrical component to a circuit board comprising:
a housing of electrically insulating material;
a plurality of recesses disposed within said housing, each of said plurality of recesses having first and second apertures, said first apertures being dimensioned to receive respective leads to the electrical component;
a plurality of resilient electrically conductive contacts disposed within said plurality of recesses each one of said plurality of contacts being unitary and having a tail depending from the contact receiving apertures, a single horizontal section traversing the contact receiving aperture to substantially seal the contact receiving aperture and to engage the distal end of a lead of the electrical component inserted into the lead receiving aperture, and a single looped section configured to engage a lead of the electrical component inserted into the lead receiving aperture, and
means to retain said plurality of contacts within said plurality of recesses.

11. The anti-wicking connector of claim 10 wherein said retaining means comprises walls integrally formed with said housing intermediate adjacent ones of said plurality of recesses said walls having end faces splayed by a heat-staking process after the insertion of said plurality of electrically conductive contacts into said plurality of recesses.

12. The anti-wicking connector of claim 10 wherein said retaining means comprises at least one lip integrally formed with said housing adjacent said plurality of recesses and wherein portions of said at least one lip are urged by heat-staking between adjacent ones of said contact tails when said plurality of contacts is disposed within respective ones of said plurality of recesses.

13. The anti-wicking connector of claim 12 wherein each of said plurality of contact horizontal sections further includes a shoulder said shoulder abutting the portion of said lip urged between adjacent ones of said contact tails when said plurality of contacts is disposed within respective ones of said plurality of recesses.

14. The electrical connector of claim 1, wherein the single looped section has an end portion engageable with the confronting wall of the recess in the absence of an inserted integrated circuit lead, said end portion being engageable with the lead when it is inserted into the recess.

* * * * *